United States Patent [19]
Hsu

[11] Patent Number: 5,504,024
[45] Date of Patent: Apr. 2, 1996

[54] METHOD FOR FABRICATING MOS TRANSISTORS

[75] Inventor: Chen-Chung Hsu, Taichung, Taiwan

[73] Assignee: United Microelectronics Corp., Taiwan

[21] Appl. No.: 502,060

[22] Filed: Jul. 14, 1995

[51] Int. Cl.[6] .............................................. H01L 21/8234
[52] U.S. Cl. ................... 437/44; 437/41; 437/164; 437/913
[58] Field of Search ............... 437/44, 164, 162, 437/41 RLD, 913, 40 R, 41 R, 415 W, 29

[56] References Cited

U.S. PATENT DOCUMENTS

| | | | |
|---|---|---|---|
| 4,697,333 | 10/1987 | Nakahara | 437/44 |
| 5,089,435 | 2/1992 | Akiyama | 437/162 |
| 5,170,232 | 12/1992 | Narita | 437/41 RLD |
| 5,179,034 | 1/1993 | Mori et al. | 437/164 |
| 5,320,974 | 6/1994 | Hori et al. | 437/45 |
| 5,342,797 | 8/1994 | Sapp et al. | 437/164 |

FOREIGN PATENT DOCUMENTS

| | | | |
|---|---|---|---|
| 61-29176 | 2/1986 | Japan | 437/44 |
| 6188257 | 7/1994 | Japan | 437/44 |

*Primary Examiner*—Brian E. Hearn
*Assistant Examiner*—Michael Trinh
*Attorney, Agent, or Firm*—Cushman Darby & Cushman

[57] ABSTRACT

A method for fabricating a MOS transistor includes forming an oxide layer over a silicon substrate of a first conductivity type. A gate electrode is formed over the oxide layer. Ions of a second conductivity type are implanted into the silicon substrate to form lightly-doped source/drain regions. Impurity-containing spacers are formed on sidewalls of the oxide layer and the gate electrode. The spacers are thermally processed to drive impurities of a first conductivity type into the source/drain regions. Finally, ions of a second conductivity type are implanted into the substrate to form heavily-doped source/drain regions.

12 Claims, 3 Drawing Sheets

METHOD FOR FABRICATING MOS TRANSISTORS

BACKGROUND OF THE INVENTION

1. Field of the Invention

The present invention relates to the fabrication of semiconductor devices, and more specifically, to a method for fabricating MOS transistors.

2. Description of Related Art

As the density of devices in an integrated circuit increases, a number of undesirable effects that prevent the devices from achieving normal operation have become more significant. For example, the shrinkage of channel length in a transistor device results in a hot-electron effect, which causes gate leakage current and oxide traps, thus affecting the reliability of the device. Therefore, in order to eliminate the undesirable effects and improve performance of integrated circuits, the structures and manufacturing processes of semiconductor devices have been modified when such devices are used in the fabrication of high density integrated circuits.

Among all the proposed structures of the semiconductor devices, transistors with a lightly-doped drain (LDD) structure have proven to have a good immunity from the so called "hot-electron effect". A brief description of the manufacturing processes of the LDD transistor is provided with reference to the cross-sectional views of FIG. 1A and FIG. 1B.

FIG. 1A illustrates a gate oxide layer 11 and a polysilicon gate electrode 12 that are respectively formed over a P-type silicon substrate 10 to constitute a gate structure. The gate structure is used as a mask, and an ion implantation step is performed to form lightly-doped source/drain regions 13 in silicon substrate 10. The ion implantation step can be carried out, for example, by implanting phosphorous ions into the substrate, thus forming N-type diffusion regions.

Referring to FIG. 1B, spacers 14 are formed on sidewalls of the gate structure. Then another ion implantation step is performed to form heavily-doped source/drain regions 15 in silicon substrate 10. The ion implantation step is carried out by implanting arsenic ions into the substrate through the mask of the gate structure and spacers 14, thus forming N-type heavily doped source/drain regions 15.

The structure of FIG. 1B somewhat reduces the electric field in the channel and drain regions. However, if an even smaller dimension of the transistor is required, the electric field in the above-mentioned LDD structure is again high enough to generate hot electrons. These hot electrons will induce a hot-electron effect, that is, these hot electrons will be trapped in the gate oxide or fly into the gate electrode and create a gate leakage current, thus reducing the saturation current of the transistor. Moreover, an electron-hole pair impact region will exist near the junction of the drain-substrate regions due to the high electric field thereof, thus affecting the performance of the transistor.

SUMMARY OF THE INVENTION

Therefore, the present invention provides a method for fabricating MOS transistors which have high immunity to the hot-electron effect.

The present invention also provides a method for fabricating MOS transistors to improve the performance of the transistors without increasing the complexity of the fabrication process.

The method for fabricating a MOS transistor according to a preferred embodiment of the present invention comprises the following steps. First, an oxide layer is formed over a silicon substrate of a first conductivity type. Second, a gate electrode is formed over the oxide layer. Third, ions of a second conductivity type are implanted into the silicon substrate to form lightly-doped source/drain regions. Next, impurity-containing spacers are formed on sidewalls of the oxide layer and the gate electrode. The spacers are thermally processed to drive impurities of the first conductivity type into the source/drain regions. Finally, ions of the second conductivity type are implanted into the substrate to form heavily-doped source/drain regions.

The MOS transistor fabricated according to the above-described method has the strongest electric field region at about a depth of from 100 to 500 Å beneath the gate oxide layer in the substrate, thereby preventing the generation of hot electrons, and leaving the channel saturation current unaffected. Furthermore, the process according to the present invention does not require any additional photomask or any complex procedures. Therefore, the manufacturing costs do not increase.

BRIEF DESCRIPTION OF THE DRAWINGS

Other objects, features, and advantages of the present invention will become apparent from the following detailed description of the preferred but non-limiting embodiments. The description is made with reference to the accompanying drawings in which.

DETAILED DESCRIPTION OF THE PRESENTLY PREFERRED EXEMPLARY EMBODIMENT

The method for fabricating a MOS transistor on a silicon substrate of a first conductivity type is explained below with respect to the preferred embodiment depicted in FIG. 2A through FIG. 2D.

Figure 1A:
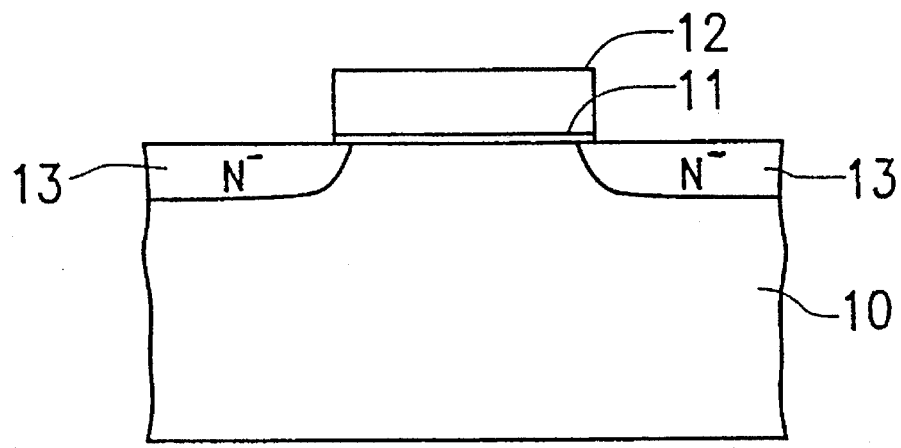
FIG. 1A and FIG. 1B are cross-sectional views illustrating the process of forming a known LDD MOS transistor.
Figure 1B:
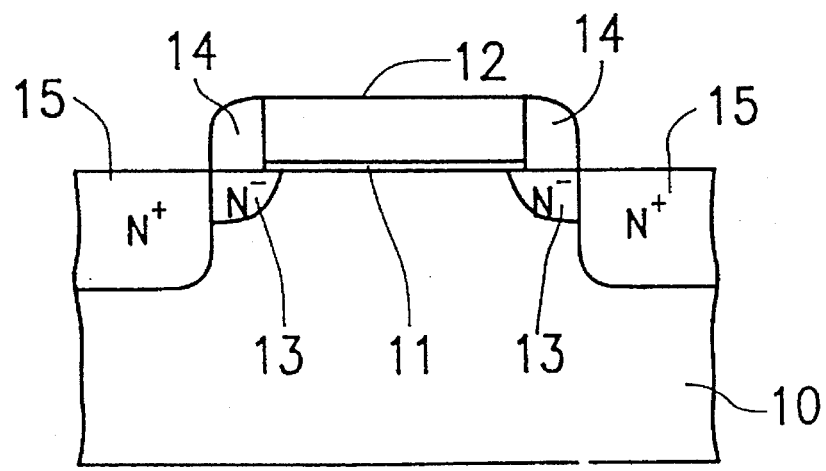
Figure 2A:
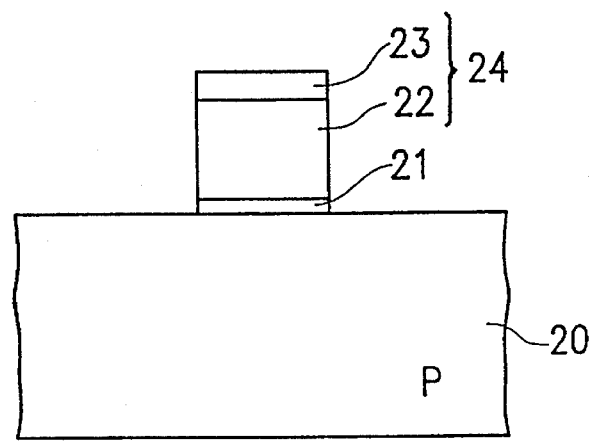
FIG. 2A through FIG. 2D are cross-sectional views illustrating the process of forming a MOS transistor according to the preferred embodiment of the present invention.

First, referring to FIG. 2A, a thermal oxidation process or a chemical vapor deposition (CVD) procedure is performed to form an oxide layer 21 over silicon substrate 20. Oxide layer 21 is provided for the gate oxide, therefore, it preferably should have a thickness between about 50 and 200 Å. A gate electrode 24 is formed over oxide layer 21. Gate electrode 24 can be formed of polysilicon 22 only or, in order to increase the conductivity, a metal silicide layer 23 can be formed on polysilicon gate 22. Polysilicon gate 22 is formed by depositing a polysilicon layer having a thickness of between about 1000 and 4000 Å, and then etching back according to a predetermined pattern to form the gate structure. Metal silicide gate 23, formed of, for example, tungsten silicide ($WSi_x$), should preferably have a thickness between about 1000 and 2000 Å.

Figure 2B:
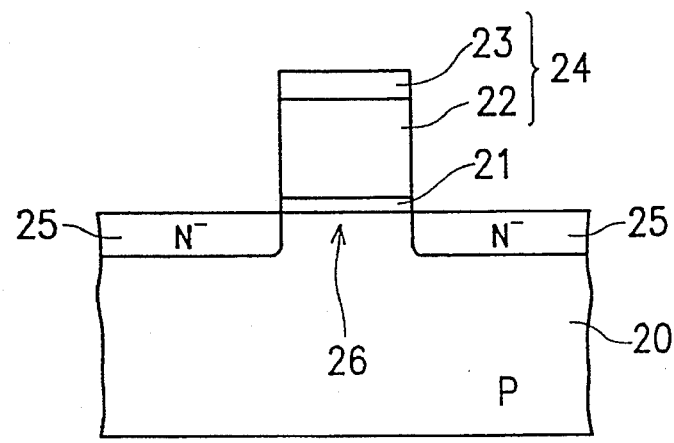

Next referring to FIG. 2B, an ion implantation step is performed in order to form lightly-doped source/drain regions 25 in silicon substrate 20. The ion implantation step is carried out by implanting ions of a second conductivity type through the masking of gate electrode 24, thus forming the separated source/drain regions 25 of the second conductivity type in substrate 20. For example, if the silicon substrate is P-type, that is, the first conductivity type is P-type and the second conductivity type is N-type, the ion implantation step can be carried out by implanting phosphorous ions into the substrate at an implanting energy between about 30 and 80 KeV and a dosage between about $1\times10^{13}$ and $1\times10^{14}$ cm$^{-2}$. Therefore, a channel region 26 is defined under gate electrode 24 between source/drain regions 25 in the substrate.

Figure 2C:
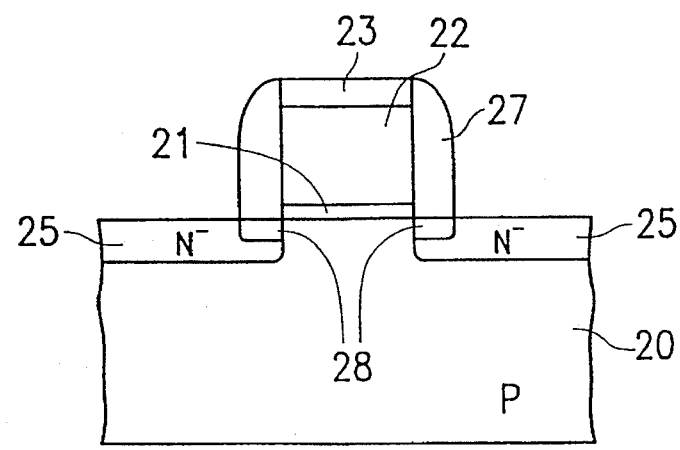

Referring to FIG. 2C, spacers 27 containing impurities of the first conductivity type are formed on sidewalls of gate electrode 22 and 23 and oxide layer 21. For example, since boron ions are impurities of the first conductivity type in the preferred embodiment, spacers 27 can be formed by boron-silicate-glass (BSG). That is, spacers 27 are formed by depositing a BSG layer to a thickness between about 1000 and 2500 Å, and then etching back to a thickness between about 500 and 1500 Å for the sidewalls. The etching back process is preferably carried out by the method of reactive ion etching (RIE). The boron concentration in the BSG layer is preferably between about $1\times10^{17}$ and $1\times10^{19}$ cm$^{-3}$. Therefore, a subsequent thermal process applied to spacers 27 drives the impurities therein into silicon substrate 20 and form diffusion regions 28, as pictured. The thermal process can be a rapid thermal annealing (RTA) process which is preferably carried out at a temperature between about 800° C. and 1500° C. for 5–30 seconds. After the RTA process, diffusion regions 28 will have a depth between about 100 and 500 Å in the substrate. Since diffusion regions 28 are formed of impurities of the first conductivity type, they will compensate for impurities of the second conductivity type in lightly-doped source/drain regions 25, thus further decreasing the dopant concentration near the drain-substrate junction.

Finally, another ion implantation step is performed to form heavily-doped source/drain regions 29 in silicon substrate 20. As shown in to FIG. 2D, ions of the second conductivity type are implanted into substrate 20 by the masking of gate electrode 22 and 23 and spacers 27, thus forming source/drain regions of the second conductivity type in substrate 20. The ion implantation step can be carried out by implanting arsenic ions at an implanting energy between about 50 and 100 KeV and a dosage between about $1\times10^{15}$ and $1\times10^{16}$ cm$^{-2}$.

Figure 2D:
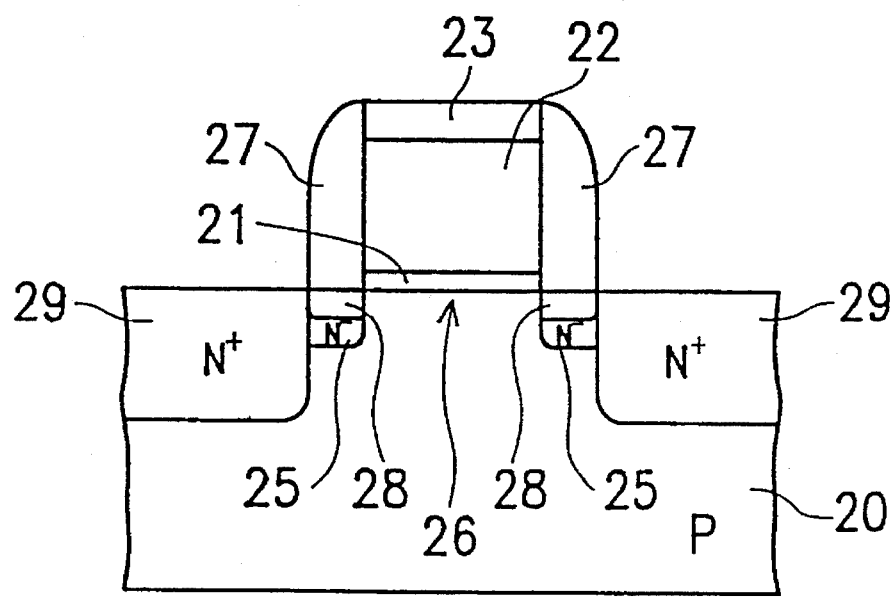

Since diffusion regions 28 of the transistor shown in FIG. 2D have a depth of about 100–500 Å in silicon substrate 20, the highest electric field of the transistor will also be shifted deep into substrate 20, for example, in lightly-doped regions 25. Obviously, the probability that the hot electrons travel into gate electrode 22 through gate oxide 21 is decreased. Therefore, the hot electron effect is suppressed and the performance of the transistor is improved.

Figure 3:
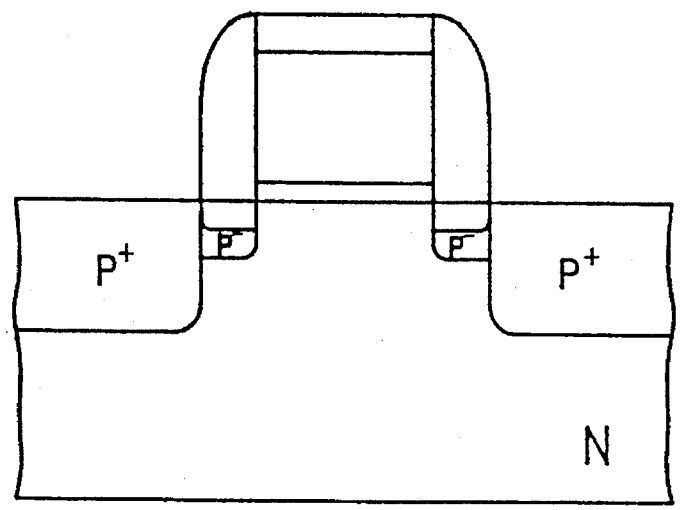
FIG. 3 is a cross-sectional view illustrating a MOS transistor according to another example of the present invention.

The aforementioned preferred embodiment of the present invention has shown the manufacturing processes of an N-type MOS transistor, while the same fabricating steps are available to fabricate a P-type MOS transistor by changing the conductivity types of the silicon substrate and the doping ions. The P-type MOS transistor fabricated according to the method of the present invention, as depicted in FIG. 3, also has the advantage of shifting the strongest electric field region away from the substrate surface, thus improving the performance.

What is claimed is:

1. A method for fabricating a MOS transistor on a silicon substrate of a first-conductivity type, comprising the steps of:

forming an oxide layer over said silicon substrate;

forming a gate electrode over said oxide layer, said gate electrode and said oxide layer including sidewalls;

forming lightly-doped source/drain regions of a second conductivity type in said silicon substrate using the gate electrode as a mask, forming spacers on said sidewalls of said oxide layer and said gate electrode; wherein said spacers contain impurities of said first conductivity type;

thermally processing said spacers to drive impurities of said first conductivity type into said lightly-doped source/drain regions; and forming heavily-doped source/drain regions of said second conductivity type in said silicon substrate using the spacers as masks.

2. The method of claim 1, wherein said first conductivity type is P-type and said second conductivity type is N-type.

3. The method of claim 1, wherein said first conductivity type is N-type and said second conductivity type is P-type.

4. The method of claim 1, wherein said spacers are formed by the steps of:

depositing a boron-silicate-glass layer to a thickness between about 1000 and 2500 Å; and etching said boron-silicate-glass layer to leave said spacers with a thickness between about 500 and 1500 Å.

5. The method of claim 4, wherein said boron-silicate-glass layer has a boron concentration between about $1\times10^{17}$ and $1\times10^{19}$ cm$^{-3}$.

6. The method of claim 5, wherein said thermally processing step includes the steps of performing the processing at a temperature between about 800° and 1500° C. for about 5 to 30 seconds; and thus driving the boron ions into said substrate to a depth of about 100 to 500 Å.

7. The method of claim 1, wherein said step of forming said oxide layer includes the steps of:

providing said oxide layer as a gate oxide, and depositing said oxide layer to have a thickness between about 50 and 200 Å.

8. The method of claim 1, wherein said step of forming said gate electrode includes forming said gate electrode so that it consists essentially of polysilicon, and has a thickness between about 1000 and 4000 Å.

9. The method of claim 1, wherein said step of forming said gate electrode includes forming said gate electrode so that it consists essentially of polysilicon and metal silicide.

10. The method of claim 9, wherein said step of forming said gate electrode includes forming said metal silicide as a layer of tungsten silicide with a thickness between about 1000 and 2000 Å.

11. The method of claim 1, wherein said step of forming said lightly-doped source/drain regions includes the steps of implanting phosphorous ions into said silicon substrate at an implanting energy between about 30 and 80 KeV and a dosage between about $1\times10^{13}$ and $1\times10^{14}$ cm$^{-2}$.

12. The method of claim 1, wherein said step of forming said heavily-doped source/drain regions includes the step of implanting arsenic ions into said silicon substrate at an implanting energy between about 50 and 100 KeV and a dosage between about $1\times10^{15}$ and $1\times10^{16}$ cm$^{-2}$.

* * * * *